(12) United States Patent
Liao et al.

(10) Patent No.: US 10,414,088 B2
(45) Date of Patent: Sep. 17, 2019

(54) PLATFORM STRUCTURE FOR USE IN LOW-TEMPERATURE MANUFACTURING OF SCAFFOLD FOR USE IN TISSUE ENGINEERING AND METHOD OF LOW-TEMPERATURE MANUFACTURING SCAFFOLD FOR USE IN TISSUE ENGINEERING

(71) Applicant: NATIONAL CENTRAL UNIVERSITY, Taoyuan (TW)

(72) Inventors: Chao-Yaug Liao, Taipei (TW);
Ching-Shiow Tseng, Taoyuan (TW);
Fang-Chieh Tu, Taoyuan (TW);
Yen-Sheng Lin, Taichung (TW);
Wei-Jen Wu, Taoyuan (TW)

(73) Assignee: NATIONAL CENTRAL UNIVERSITY (TW)

( * ) Notice: Subject to any disclaimer, the term of this patent is extended or adjusted under 35 U.S.C. 154(b) by 124 days.

(21) Appl. No.: 15/171,093

(22) Filed: Jun. 2, 2016

(65) Prior Publication Data

US 2017/0190106 A1    Jul. 6, 2017

(30) Foreign Application Priority Data

Dec. 30, 2015   (TW) .............................. 104144555 A (51) Int. Cl.
*B29C 64/106*    (2017.01)
*B29C 64/20*    (2017.01)
(Continued)

(52) U.S. Cl.
CPC ............ *B29C 64/106* (2017.08); *B29C 64/20* (2017.08); *B29C 64/205* (2017.08);
(Continued)

(58) Field of Classification Search
CPC .............................. B29C 64/40; B29C 64/106
See application file for complete search history.

(56) References Cited

U.S. PATENT DOCUMENTS

| 2,666,520 A | * | 1/1954 | English | .................. B41B 11/38 |
| | | | | 199/50 |
| 3,143,167 A | * | 8/1964 | Vieth | ................. G05D 23/1912 |
| | | | | 165/169 |

(Continued)

OTHER PUBLICATIONS

Xu, M., et al., 2010. Fabricating a pearl/PLGA composite scaffold by the low-temperature deposition manufacturing technique for bone tissue engineering. Biofabrication, 2(2), p. 025002. <http://iopscience.iop.org/article/10.1088/1758-5082/2/2/025002/pdf> (Year: 2012).*

(Continued)

*Primary Examiner* — Robert C Dye
*Assistant Examiner* — Nicholas R Krasnow
(74) *Attorney, Agent, or Firm* — Schmeiser, Olsen & Watts, LLP (57) ABSTRACT

A platform structure for manufacturing a scaffold for use in tissue engineering, comprising a frame; a ring-shaped thermally conductive member fixedly disposed in the frame; a thermally conductive platform centrally movably disposed in the ring-shaped thermally conductive member and having edges in direct contact with inner walls of the ring-shaped thermally conductive member, wherein the thermally conductive platform and the ring-shaped thermally conductive member together define a space of a variable depth; a vertically movable mechanism connected to a bottom of the thermally conductive platform and adapted to drive the thermally conductive platform to sink and thus increase gradually the depth of the space; and a low temperature generating mechanism connected to the ring-shaped thermally conductive member and the thermally conductive (Continued)

platform to cool down the ring-shaped thermally conductive member and the thermally conductive platform, to prevent deformation and ensure uniform dimensions of tall scaffolds.

18 Claims, 7 Drawing Sheets

(51) Int. Cl.
| | |
|---|---|
| B29C 64/321 | (2017.01) |
| B29C 64/371 | (2017.01) |
| B29C 64/209 | (2017.01) |
| B29C 64/314 | (2017.01) |
| B29C 64/205 | (2017.01) |
| B29C 64/30 | (2017.01) |
| B29C 64/307 | (2017.01) |
| B29C 64/364 | (2017.01) |
| B29C 64/40 | (2017.01) |
| B29C 64/245 | (2017.01) |
| B29K 105/04 | (2006.01) |
| B33Y 10/00 | (2015.01) |
| B33Y 30/00 | (2015.01) |
| B81C 1/00 | (2006.01) |

(52) U.S. Cl.
CPC .......... *B29C 64/209* (2017.08); *B29C 64/245* (2017.08); *B29C 64/30* (2017.08); *B29C 64/307* (2017.08); *B29C 64/314* (2017.08); *B29C 64/321* (2017.08); *B29C 64/364* (2017.08); *B29C 64/371* (2017.08); *B29C 64/40* (2017.08); *B29K 2105/04* (2013.01); *B29K 2995/0013* (2013.01); *B33Y 10/00* (2014.12); *B33Y 30/00* (2014.12); *B81C 1/00206* (2013.01)

(56) References Cited

U.S. PATENT DOCUMENTS

| | | | | |
|---|---|---|---|---|
| 4,195,131 | A * | 3/1980 | Papas | C12M 23/10 435/286.1 |
| 4,800,164 | A * | 1/1989 | Bisconte | C12M 41/36 435/286.4 |
| 5,143,663 | A * | 9/1992 | Leyden | B29C 64/135 264/401 |
| 5,474,719 | A * | 12/1995 | Fan | B29C 41/12 264/401 |
| 5,622,577 | A * | 4/1997 | O'Connor | B22F 3/1055 156/62.2 |
| 5,698,260 | A * | 12/1997 | Roth | B05C 7/04 118/306 |
| 5,775,402 | A * | 7/1998 | Sachs | B22C 9/065 164/4.1 |
| 5,846,370 | A * | 12/1998 | O'Connor | B33Y 10/00 156/272.8 |
| 5,980,812 | A * | 11/1999 | Lawton | B22F 1/0003 264/401 |
| 6,070,551 | A * | 6/2000 | Li | C23C 16/401 118/723 I |
| 6,079,375 | A * | 6/2000 | Duerr | F02F 1/14 123/41.72 |
| 6,086,831 | A * | 7/2000 | Harness | B01J 19/0046 165/263 |
| 6,239,602 | B1 * | 5/2001 | Nakagomi | G01R 31/2874 165/80.4 |
| 6,253,116 | B1 * | 6/2001 | Zhang | B33Y 10/00 700/119 |
| 6,409,837 | B1 * | 6/2002 | Hillman | C23C 16/4486 118/712 |
| 9,723,866 | B2 * | 8/2017 | Lipson | A23P 20/20 |
| 9,764,515 | B2 * | 9/2017 | Yost | B29C 64/386 |
| 2002/0195746 | A1 * | 12/2002 | Hull | B29C 64/124 264/401 |
| 2002/0195747 | A1 * | 12/2002 | Hull | B29C 41/12 264/401 |
| 2003/0090034 | A1 * | 5/2003 | Mulhaupt | B29C 31/045 264/255 |
| 2003/0175410 | A1 * | 9/2003 | Campbell | A61L 27/38 427/2.24 |
| 2006/0054039 | A1 * | 3/2006 | Kritchman | B29C 41/48 101/424.1 |
| 2006/0201187 | A1 * | 9/2006 | Smolko | A41D 13/0053 62/315 |
| 2007/0012423 | A1 * | 1/2007 | Kinoshita | H01L 23/473 165/80.4 |
| 2007/0026145 | A1 * | 2/2007 | Lindemann | B29C 64/153 427/248.1 |
| 2007/0170140 | A1 * | 7/2007 | Gaunekar | B23Q 1/012 212/312 |
| 2008/0006617 | A1 * | 1/2008 | Harris | F27B 17/0025 219/390 |
| 2008/0190905 | A1 * | 8/2008 | Heinlein | B29C 64/153 219/121.73 |
| 2010/0135888 | A1 * | 6/2010 | Fishman | C01B 33/037 423/348 |
| 2010/0291176 | A1 * | 11/2010 | Chian | A61L 27/38 424/423 |
| 2011/0189466 | A1 * | 8/2011 | Jaggi | C23C 4/06 428/304.4 |
| 2012/0080814 | A1 * | 4/2012 | Sun | B29C 48/87 264/176.1 |
| 2012/0116568 | A1 * | 5/2012 | Murphy | B41J 3/407 700/118 |
| 2012/0119399 | A1 * | 5/2012 | Fruth | B29C 67/0077 264/39 |
| 2013/0089642 | A1 * | 4/2013 | Lipson | A23P 20/20 426/115 |
| 2013/0177972 | A1 * | 7/2013 | Green | C12M 21/08 435/288.7 |
| 2014/0377038 | A1 * | 12/2014 | Malin | B25J 11/00 414/222.01 |
| 2015/0009624 | A1 * | 1/2015 | Dunwoody | F28F 9/007 361/688 |
| 2015/0035206 | A1 * | 2/2015 | Maggiore | B29C 64/00 264/401 |
| 2015/0037836 | A1 * | 2/2015 | Morris | G01N 1/42 435/40.5 |
| 2015/0050377 | A1 * | 2/2015 | Shi | B33Y 80/00 425/150 |
| 2015/0375453 | A1 * | 12/2015 | Yost | B29C 64/386 435/174 |
| 2016/0053213 | A1 * | 2/2016 | Hedberg | C12M 23/08 435/296.1 |
| 2016/0068793 | A1 * | 3/2016 | Maggiore | C12M 21/08 435/289.1 |
| 2016/0083681 | A1 * | 3/2016 | Tavana | C12M 21/08 264/308 |
| 2016/0114326 | A1 * | 4/2016 | Schryver | F25D 3/125 62/465 |
| 2016/0159006 | A1 * | 6/2016 | Wang | B33Y 30/00 425/166 |
| 2016/0207690 | A1 * | 7/2016 | Soules | B65D 81/3813 |
| 2016/0236299 | A1 * | 8/2016 | Oberhofer | B23K 26/144 |
| 2016/0236409 | A1 * | 8/2016 | Armani | G05B 19/402 |
| 2016/0271880 | A1 * | 9/2016 | Bheda | B29C 64/20 |
| 2016/0288414 | A1 * | 10/2016 | Ozbolat | B41J 3/407 |
| 2016/0307678 | A1 * | 10/2016 | Unosson | H01F 1/15333 |
| 2016/0318260 | A1 * | 11/2016 | Hyde | B33Y 10/00 |
| 2016/0324206 | A1 * | 11/2016 | Bunker | A23G 9/28 |
| 2016/0375491 | A1 * | 12/2016 | Swaminathan | B29C 64/20 419/53 |
| 2017/0029765 | A1 * | 2/2017 | Vellinger | A61L 27/3691 |
| 2017/0107477 | A1 * | 4/2017 | Farmer | C12M 41/48 |
| 2017/0120537 | A1 * | 5/2017 | DeMuth | B28B 1/001 |
| 2017/0136540 | A1 * | 5/2017 | Dods | B29C 64/20 |
| 2017/0172765 | A1 * | 6/2017 | Solorzano | B41J 2/04 |

(56) References Cited

U.S. PATENT DOCUMENTS

| | | | |
|---|---|---|---|
| 2017/0173881 A1* | 6/2017 | Dachs, II | B33Y 10/00 |
| 2017/0192382 A1* | 7/2017 | Baecker | B33Y 30/00 |
| 2017/0283849 A1* | 10/2017 | Charrier | C12Q 1/24 |
| 2017/0328822 A1* | 11/2017 | Karbaschi | G01N 1/42 |
| 2017/0355137 A1* | 12/2017 | Ederer | B29C 64/165 |
| 2017/0361534 A1* | 12/2017 | Fernandez-Nieves | B33Y 70/00 |
| 2017/0368747 A1* | 12/2017 | Nolet | G01B 21/02 |
| 2018/0002658 A1* | 1/2018 | Miller | C12M 3/00 |
| 2018/0200790 A1* | 7/2018 | Hart | B22F 3/1055 |
| 2018/0290384 A1* | 10/2018 | Hyde | B29C 64/25 |

OTHER PUBLICATIONS

3ders—https://www.3ders.org/articles/20130815-how-do-they-3d-print-kidney-in-china.htnn (Year: 2013).*

"Palmetto Printer"—Dennis, S.G., Trusk, T., Richards, D., Jia, J., Tan, Y., Mei, Y., Fann, S., Markwald, R. and Yost, M., 2015. Viability of bioprinted cellular constructs using a three dispenser cartesian printer. Journal of visualized experiments: JoVE, (103). (Year: 2015).*

Ferry P.W. Melchels et al. "Additive manufacturing of tissues and organs"; Progress in Polymer Science 37 (2012) 1079-1104.

Bethany C. Gross et al. "Evaluation of 3D Printing and its potential impact on biotechnology and the Chemical Sciences"; 2014 American Chemical Society, pp. 3240-3253.

Zhuo Xiong et al. Fabrication of Porous Scaffolds for Bone Tissue Engineering via low-temperature deposition; Scripta Materialia 46 (2002) 771-776.

Hung-Jen Yen et al. "Evaluation of chondrocyte growth in the highly porous scaffolds made by fused deposition manufacturing (FDM) filled with type II collagen"; Biomed Microdevices (2009) 615-624.

Hung-Jen Yen et al. "Fabrication of precision scaffolds using liquid-frozen deposition manufacturing for cartilage tissue engineering"; Tissue Engineering: Part A, vol. 15, 13 pgs.

Changyong Liu et al. "Development of a novel low-temperature deposition machine using screw extrusion to fabricate poly(l-lactide-co-glycolide) acid scaffolds"; Journal of Engineering in Miedicine; vol. 228(6), 593-606

Li Liu et al. "Multinozzle Low-Temperature Deposition System for Construction of Gradient Tissue Engineering Scaffolds"; Wiley Periodicals, Inc., 254-263.

He Kai et al.: IOP Science "Fabrication of Two-Level Tumor Bone Repair Biomaterial Based on a Rapid Prototyping Technique"; 8 pgs.

Cong Bang Pham et al. "Rapid Freeze Prototyping Technique in Bio-Plotters for Tissue Scaffold Fabrication"; Rapid Prototyping Journal (2008), 246-253.

Geunhyung Kim et al. "A Cryogenic Direct-Plotting System for Fabrication of 3D Collagen Scaffolds for Tissue Engineering"; Journal of Materials Chemistry, 2009, 19, 8817-8823.

Nikhil D. Doiphode et al. "Freeze Extrusion Fabrication of 13-93 Bioactive Glass Scaffolds for Bone Repair", J. Mater Sci. Mater Med (2011) 22,515-523.

* cited by examiner

PLATFORM STRUCTURE FOR USE IN LOW-TEMPERATURE MANUFACTURING OF SCAFFOLD FOR USE IN TISSUE ENGINEERING AND METHOD OF LOW-TEMPERATURE MANUFACTURING SCAFFOLD FOR USE IN TISSUE ENGINEERING

CROSS-REFERENCE TO RELATED APPLICATION

This non-provisional application claims priority under 35 U.S.C. § 119(a) on Patent Application No(s). 104144555 filed in Taiwan, R.O.C. on Dec. 30, 2015, the entire contents of which are hereby incorporated by reference.

FIELD OF THE INVENTION

The present invention relates to platform structures and, more particularly, to a platform structure for low-temperature manufacturing of a scaffold for use in tissue engineering.

BACKGROUND OF THE INVENTION

Conventional platform structures for manufacturing a scaffold for use in tissue engineering are expected to be of a matrix structure with a high porosity to render it easy to carry and transplant cells into a patient's body. In this regard, a common manufacturing technique entails carrying out an additive manufacturing process (referring to Melchels F P W, Domingos M A N, Klein T J, et al. Additive manufacturing of tissues and organs. Prog Polym Sci 2012; 37:1079-1104.) The additive manufacturing technique falls into several categories, namely stereolithography (SLA), selective laser sintering (SLS), fused deposition manufacturing (FDM), and the like. FDM has a drawback, that is, thermal hydrolysis occurs to the materials for use in manufacturing of a scaffold for use in tissue engineering (see: Gross B C, Erkal J L, Lockwood S Y, et al. Evaluation of 3D printing and its potential impact on biotechnology and the chemical sciences. Anal Chem 2014; 86:3240-3253.) To overcome the aforesaid drawback, the related industrial sector developed a "pseudo-FDM" additive manufacturing technique (see: (1) Xiong Z, Yan Y, Wang S, et al. Fabrication of porous scaffolds for bone tissue engineering via low-temperature deposition. Scr Mater 2002; 46:771-776; (2) Yen H J, Tseng C S, Hsu S H, et al. Evaluation of chondrocyte growth in the highly porous scaffolds made by fused deposition manufacturing (FDM) filled with type II collagen. Biomed Microdevices 2009; 11:615-624; and (3) Yen H J, Hsu S H, Tseng C S, et al. Fabrication of precision scaffolds using liquid-frozen deposition manufacturing for cartilage tissue engineering. Tissue Engineering Part A 2009; 15: 965-975) for use in low-temperature manufacturing of a scaffold for use in tissue engineering.

A conventional method of manufacturing a scaffold for use in tissue engineering entails squeezing out a liquid material with horizontally and vertically movable nozzles such that the liquid material deposits on a fixed thermally conductive platform, and allowing the liquid material to freeze as soon as the liquid material comes into contact with the low-temperature thermally conductive platform. Therefore, a scaffold for use in tissue engineering is formed. Incoming liquid material deposits on the frozen liquid material to form a tall scaffold for use in tissue engineering (referring to: (1) Liu C, Li Y, Zhang L, et al. Development of a novel low-temperature deposition machine using screw extrusion to fabricate poly(L-lactide-co-glycolide) acid scaffolds. Proc IMechE Part H: J Engineering in Medicine 2014; 228:593-606; (2) Liu L, Xiong Z, Yan Y, et al. Multinozzle low-temperature deposition system for construction of gradient tissue engineering scaffolds. J. Biomed. Mater. Res. B. 2008; 86B:254-263; (3) Kai H, Wang X, Madhukar K S, et al. Fabrication of a two-level tumor bone repair biomaterial based on a rapid prototyping technique. Biofabrication 2009; 1:1-7; (4) Pham C B, Leong K F, Lim T C, et al. Rapid freeze prototyping technique in bio-plotters for tissue scaffold fabrication. Rapid Prototyping Journal 2008; 14:246-253; (5) Kim G H, Ahn S H, Yoon H, et al. A cryogenic direct plotting system for fabrication of 3D collagen scaffolds for tissue engineering. J Mater Cham 2009; 19:8817-8823; and (6) Doiphode N D, Huang T, Leu M C et al. Freeze extrusion fabrication of 13-93 bioactive glass scaffolds for bone repair. J Mater Sci Mater Med 2011; 22:515-523).

With ambient temperature being higher than the temperature of the thermally conductive platform, the greater the required deposited amount of the liquid material, the more likely the liquid material is to be affected by the ambient temperature and thus less likely to freeze, thereby resulting in the deformation of the top portion of the manufactured scaffold for use in tissue engineering, thereby rendering useless the manufactured scaffold for use in tissue engineering. Hence, the conventional method fails to manufacture a tall scaffold, say, a scaffold taller than 1 cm; and the maximum height of the scaffold which can be manufactured by the conventional method varies from thermally conductive platform to thermally conductive platform. For example, some thermally conductive platforms are accountable for the deformation of the top portion of a scaffold which is 1 cm high. Furthermore, in addition to the deformation of the top portion of a scaffold thus manufactured, ambient temperature causes uneven internal structure of a scaffold thus manufactured.

Furthermore, putting the equipment required for manufacturing conventional scaffold s for use in tissue engineering in a low-temperature room or a low-temperature workshop incur costs.

In view of this, it is important to provide a platform structure conducive to the prevention of the deformation of the top portion of a tall scaffold for use in tissue engineering and the uniform distribution of the internal structure of the tall scaffold.

SUMMARY OF THE INVENTION

It is an objective of the present invention to provide a platform structure conducive to the prevention of the deformation of the top portion of a tall scaffold for use in tissue engineering and the uniform distribution of the internal structure of the tall scaffold.

In order to achieve the above and other objectives, the present invention provides a platform structure for manufacturing a scaffold for use in tissue engineering, comprising: a frame; a ring-shaped thermally conductive member fixedly disposed in the frame; a thermally conductive platform centrally movably disposed in the ring-shaped thermally conductive member and having edges in direct contact with inner walls of the ring-shaped thermally conductive member, wherein the thermally conductive platform and the ring-shaped thermally conductive member together define a space of a variable depth; a vertically movable mechanism connected to a bottom of the thermally conductive platform and adapted to drive the thermally conductive platform to sink and thus increase gradually the depth of the space; and a low temperature generating mechanism connected to the ring-shaped thermally conductive member and the thermally conductive platform to cool down the ring-shaped thermally conductive member and the thermally conductive platform, to prevent deformation and ensure uniform dimensions of tall scaffolds.

Regarding the platform structure of the present invention, the low temperature generating mechanism is annularly disposed at an outer wall of the ring-shaped thermally conductive member.

The platform structure of the present invention further comprises a thermally insulating element for enclosing the low temperature generating mechanism.

The platform structure of the present invention further comprises a thermally insulating board disposed between the thermally conductive platform and the vertically movable mechanism.

Regarding the platform structure of the present invention, the thermally insulating board precludes heat exchange between the vertically movable mechanism and the ring-shaped thermally conductive member and the thermally conductive platform.

Regarding the platform structure of the present invention, the thermally conductive platform and the vertically movable mechanism are connected by magnetic attraction.

Furthermore, to achieve the aforesaid objective and the other objectives, the present invention further provides a method of manufacturing a scaffold for use in tissue engineering, the method comprising the steps of: (S1) providing the platform structure of any one of claims 1-9; (S3) squeezing, in the space, a liquid material out such that the liquid material deposits on a thermally conductive platform of the platform structure and freezes at low temperature, wherein the liquid material being squeezed out moves laterally relative to the platform structure; (S5) lowering the thermally conductive platform with the vertically movable mechanism to increase the depth of the space; and (S7) squeezing out the liquid material in the space of the increasing depth to allow the liquid material to deposit on the frozen liquid material, wherein the liquid material thus deposited on the frozen liquid material freezes at low temperature, and the liquid material moves laterally relative to the platform structure while being squeezed out.

In conclusion, a platform structure of the present invention precludes the deformation of the top portion of a tall scaffold S for use in tissue engineering such that the manufacturing of tall scaffolds for use in tissue engineering is feasible, and the platform structure of the present invention enables the uniform distribution of the internal structure of a scaffold for use in tissue engineering.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION OF THE PREFERRED EMBODIMENTS

Figure 1:
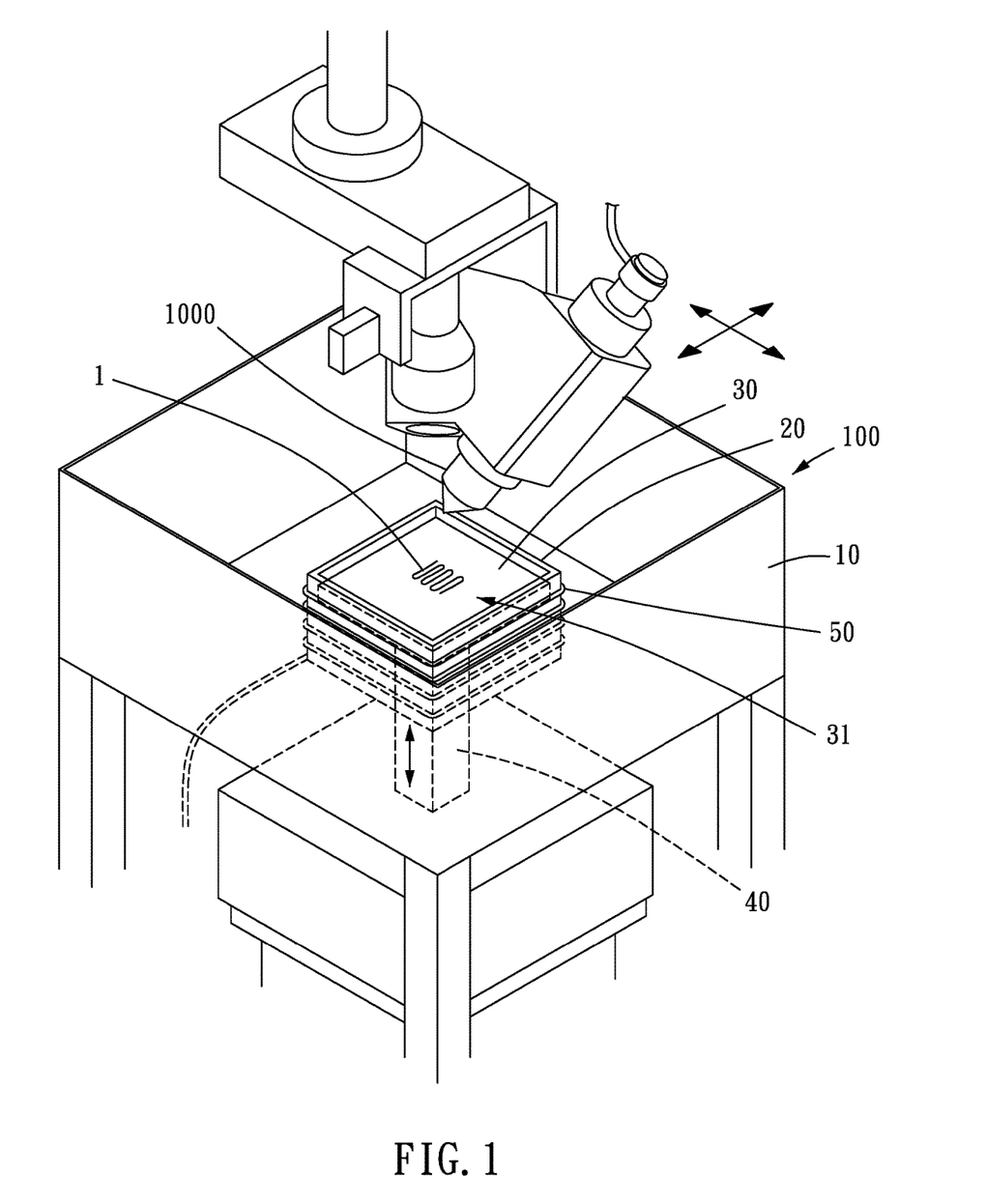
FIG. 1 is a schematic view of a platform structure according to the first embodiment of the present invention.

Referring to FIG. 1, there is shown a schematic view of a platform structure 100 for use in the manufacturing of a scaffold for use in tissue engineering according to the first embodiment of the present invention. The platform structure 100 operates in conjunction with a nozzle 1000 to manufacture a scaffold for use in tissue engineering at low temperature. The nozzle 1000 squeezes a liquid material out such that the liquid material deposits on the platform structure 100. The platform structure 100 comprises a frame 10, a ring-shaped thermally conductive member 20, a thermally conductive platform 30, a vertically movable mechanism 40 and a low temperature generating mechanism 50.

The frame 10 is centered at the nozzle 1000 and disposed below the nozzle 1000. The frame 10 is capable of thermal insulation.

The ring-shaped thermally conductive member 20 is fixedly disposed in the frame 10, centered at the nozzle 1000, and disposed below the nozzle 1000. The ring-shaped thermally conductive member 20 is rectangular, round, elliptical, or of any geometrical shape, but the present invention is not limited thereto. In an embodiment of the present invention, the ring-shaped thermally conductive member 20 is made of stainless steel and thus is not only corrosion-resistant but also easy to sterilize.

The thermally conductive platform 30 is centrally movably disposed in the ring-shaped thermally conductive member 20. The thermally conductive platform 30 has its edges in direct contact with the inner walls of the ring-shaped thermally conductive member 20. Therefore, heat energy of the ring-shaped thermally conductive member 20 is transferred to the thermally conductive platform 30. Furthermore, the thermally conductive platform 30 and the ring-shaped thermally conductive member 20 together define a space 31 of a variable depth.

Figure 2:
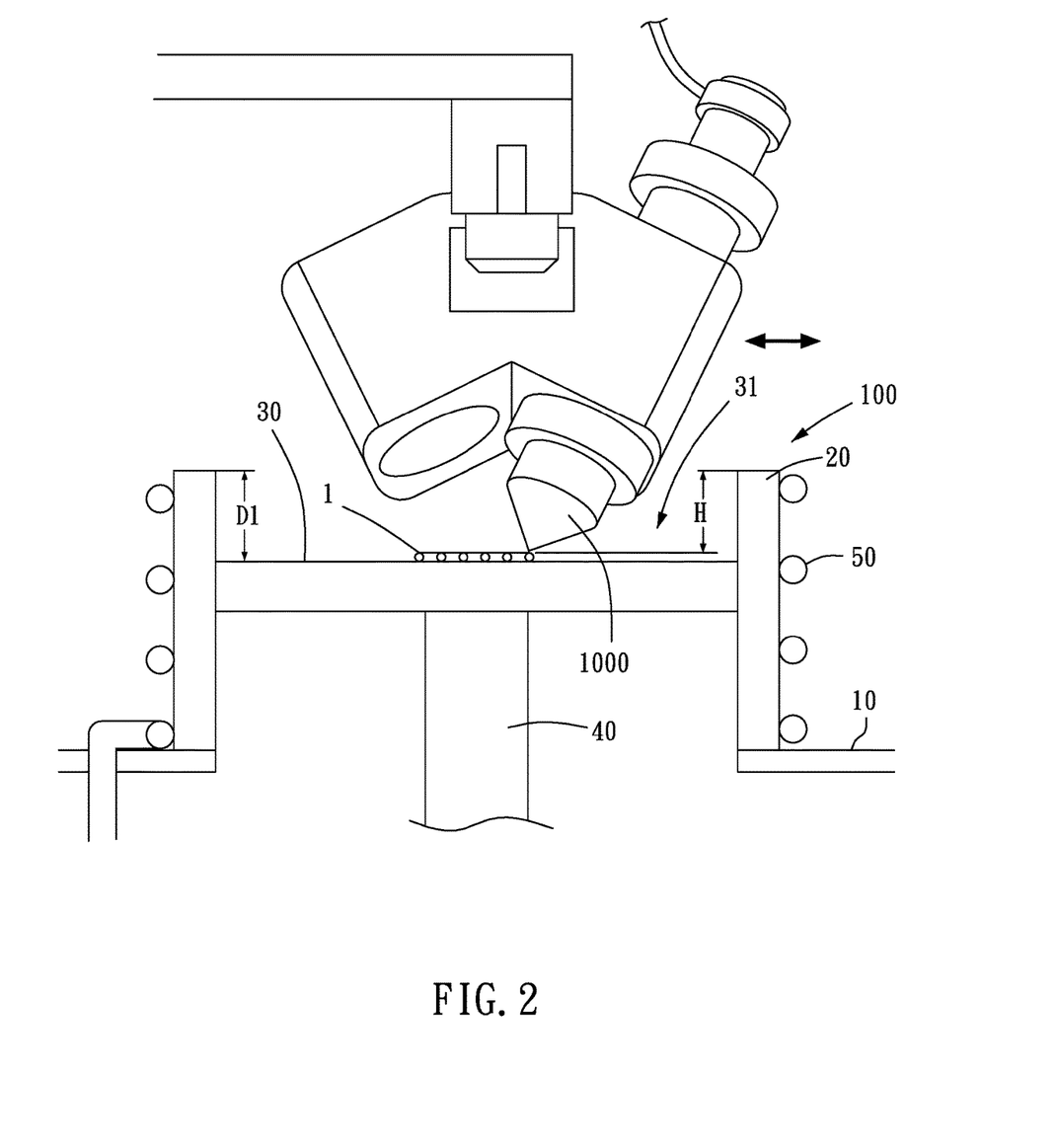
FIG. 2 is a cross-sectional view of a first liquid material layer frozen on the platform structure.
Figure 3:
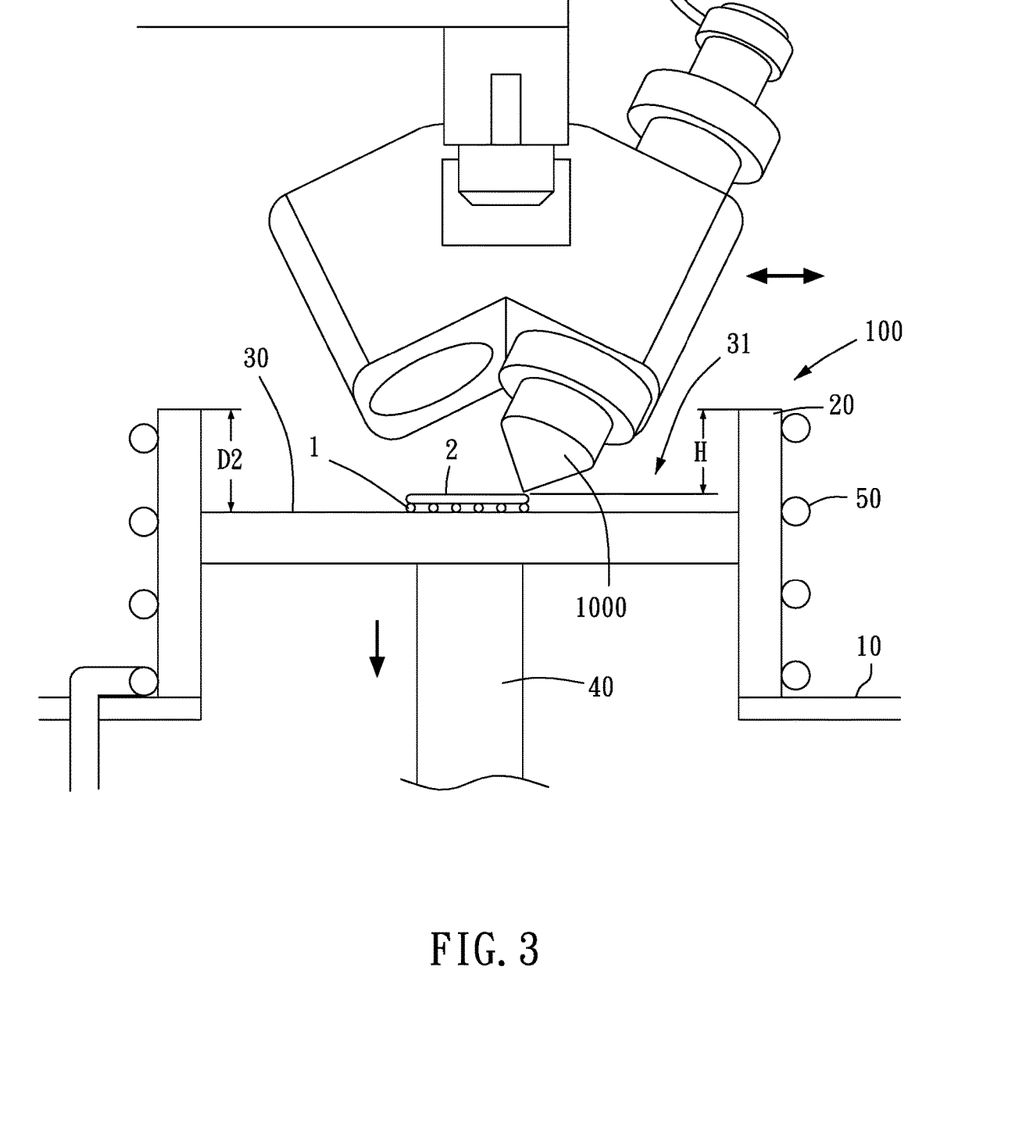
FIG. 3 is a cross-sectional view of a second liquid material layer frozen on the platform structure.
Figure 4:
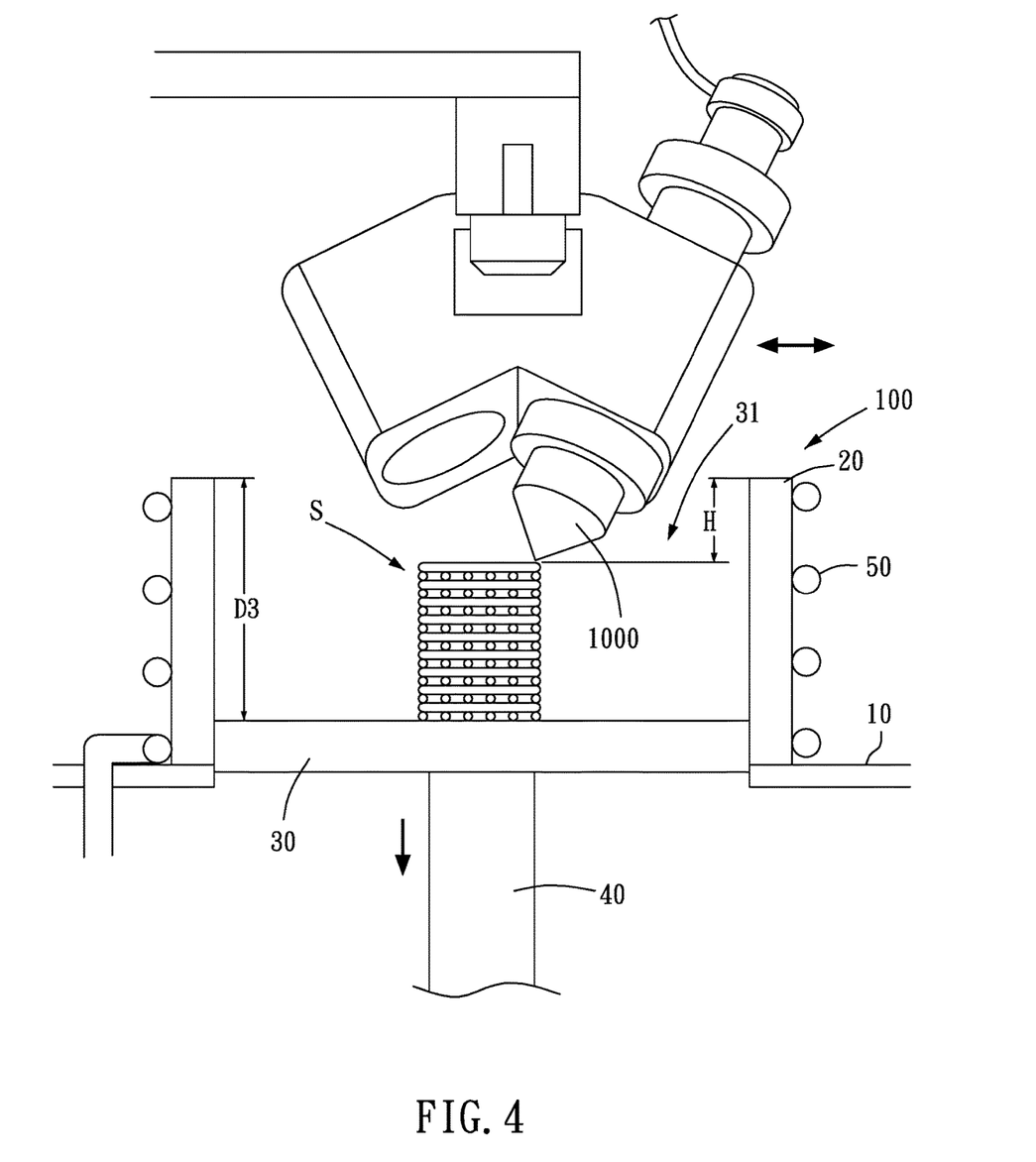
FIG. 4 is a cross-sectional view of a scaffold for use in tissue engineering, which is frozen on the platform structure.

The vertically movable mechanism 40 is connected to the bottom of the thermally conductive platform 30 and adapted to drive the thermally conductive platform 30 to sink and thus increase gradually the depth of the space 31. Referring to FIG. 2 through FIG. 4, the depth is denoted with D1-D3. The space 31 deepens and enlarges gradually in the course of the manufacturing of a scaffold for use in tissue engineering.

The low temperature generating mechanism 50 is connected to the ring-shaped thermally conductive member 20 to cool down the ring-shaped thermally conductive member 20. The low temperature generating mechanism 50 is disposed at the outer wall of the ring-shaped thermally conductive member 20. The low temperature generating mechanism 50 is provided in the form of a thermally conductive copper pipe which contains a coolant for providing a low temperature. Referring to FIG. 1, a peristaltic pump enables low-temperature alcohol to circulate in the low temperature generating mechanism 50 continuously and thus allows the low temperature generating mechanism 50 to cool down the ring-shaped thermally conductive member 20; hence, the ring-shaped thermally conductive member 20 cools down the thermally conductive platform 30. Furthermore, the low temperature generating mechanism 50 is connected to the thermally conductive platform 30 in a manner not shown in FIG. 1 to therefore cool down the thermally conductive platform 30 in the aforesaid manner, thereby allowing the thermally conductive platform 30 to cool down the ring-shaped thermally conductive member 20.

The low temperature generating mechanism 50 provides a low temperature at which the liquid material for use in manufacturing a scaffold for use in tissue engineering freezes quickly. The low temperature provided by the low temperature generating mechanism 50 varies according to the freezing point of the liquid material and the condensation time. Furthermore, since the aforesaid cooling process is inevitably accompanied by ambient heat absorption which mitigates the cooling effect, the low temperature generated from the low temperature generating mechanism 50 must be lower than the temperature of the ring-shaped thermally conductive member 20. For example, to enable the ring-shaped thermally conductive member 20, the thermally conductive platform 30 and the space 31 to stay at −30°, the low temperature generating mechanism 50 must generate a temperature lower than −30°.

Figure 7:
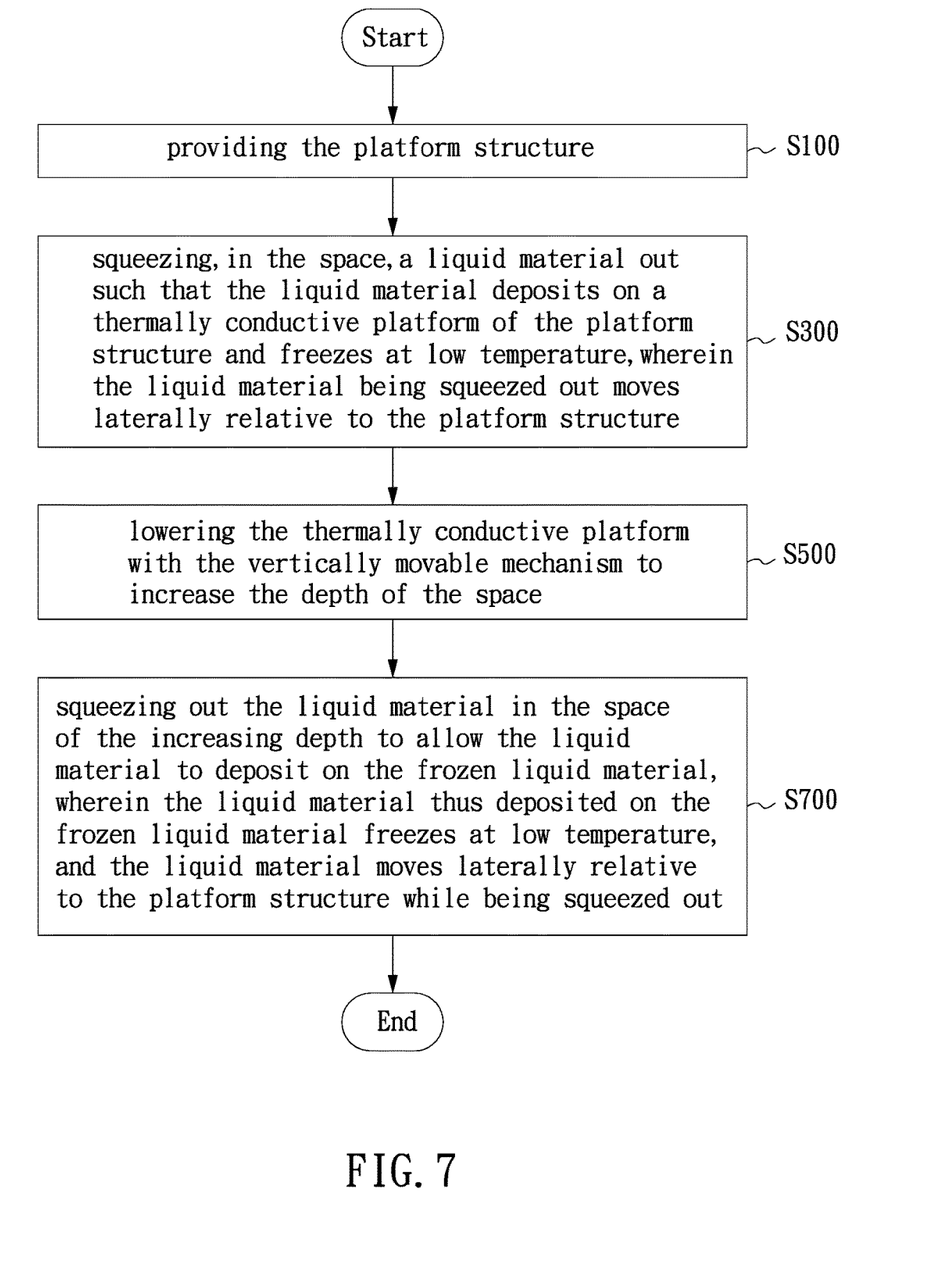
FIG. 7 is a flowchart of a method of manufacturing a scaffold for use in tissue engineering according to the present invention.

FIG. 2 through FIG. 4 and FIG. 7 show how to manufacture a scaffold for use in tissue engineering with the platform structure 100 at low temperature. FIG. 7 is a flowchart of a method of manufacturing a scaffold for use in tissue engineering according to the present invention.

Referring to FIG. 2 and FIG. 7, step S100 entails providing the platform structure 100, driving, with a vertically movable mechanism 40 of the platform structure 100, the thermally conductive platform 30 to descend by a distance D1, so as to form the space 31. The initial distance D1 by which the thermally conductive platform 30 descends is preferably at least 1 cm; hence, the temperature of the space 31 is unlikely to be affected by the ambient temperature. Referring to FIG. 2 and FIG. 7, step S300 involves depositing a liquid material on the thermally conductive platform 30 in the space 31 such that the liquid material thus deposited on the thermally conductive platform 30 freezes at a low temperature to thereby form a first liquid material layer 1. The nozzle 1000 for squeezing out the liquid material 1 moves laterally relative to the platform structure 100 in the direction indicated by the arrows shown in FIG. 1 and FIG. 2. Hence, the nozzle 1000 is spaced apart from the opening at the top portion of the ring-shaped thermally conductive member 20 by a fixed height H. The fixed height H is slightly less than the distance D1 to render it easy to deposit the liquid material 1 on the thermally conductive platform 30. Referring to FIG. 3 and FIG. 7, step S500 involves increasing depth D2 of the space 31 by lowering the thermally conductive platform 30 with the vertically movable mechanism 40. Referring to FIG. 3 and FIG. 7, step S700 involves squeezing out the liquid material in the space 31 of the depth D2 and depositing the liquid material on the frozen liquid material (i.e., the first liquid material layer 1), wherein the liquid material thus deposited on the frozen liquid material (i.e., the first liquid material layer 1) freezes at a low temperature to eventually form a second liquid material layer 2, wherein the nozzle 1000 for squeezing out the liquid material moves laterally relative to the platform structure 100.

Repeating step S500 and step S700 to form a scaffold S for use in tissue engineering as shown in FIG. 4. Since the ring-shaped thermally conductive member 20 cools down the thermally conductive platform 30, both the ring-shaped thermally conductive member 20 and the thermally conductive platform 30 end up with substantially the same low temperature which is also substantially the same as that of the space 31 together defined by the ring-shaped thermally conductive member 20 and the thermally conductive platform 30. Therefore, the liquid material squeezed out of the nozzle 1000 deposits and freezes on the frozen liquid material at the aforesaid low temperature such that the scaffold S for use in tissue engineering features uniform distribution of the internal structure. Even though the scaffold S for use in tissue engineering is taller than 1 cm, its top portion does not deform because of variation in room temperature.

Referring to FIG. 2 through FIG. 4, since the liquid material squeezed out of the nozzle 1000 ends up with the same difference in height relative to the opening of the top portion of the ring-shaped thermally conductive member 20, that is, a fixed height H, the temperatures of the liquid material squeezed out of the nozzle 1000 in step S300 and step S700 are identical. Therefore, the liquid material squeezed out and frozen, at substantially the same lower temperature, on the frozen liquid material. With the thermally conductive platform 30 being continuously lowered with the vertically movable mechanism 40, the frozen liquid material stays at a low-temperature environment (i.e., the space 31); hence, the frozen liquid material will remain frozen unless and until the scaffold S for use in tissue engineering is formed.

The nozzle 1000 never moves deep into the space 31 while squeezing out the liquid material; hence, the liquid material stored in the nozzle 1000 is unlikely to freeze despite the low temperature of the space 31, thereby allowing the liquid material to be squeezed out of the nozzle 1000 smoothly.

Furthermore, since the edge of the frame 10 is higher than the ring-shaped thermally conductive member 20, there is minimal exchange of heat between the low temperature generating mechanism 50 and the outside of the frame 10, nor can the ring-shaped thermally conductive member 20 be affected by the ambient temperature outside the frame 10 and the temperature of the thermally conductive platform 30 and the space 31.

To facilitate subsequent processing, such as freeze-drying, it is feasible to separate the thermally conductive platform 30 and the vertically movable mechanism 40 upon completion of the formation of the scaffold S for use in tissue engineering. To render the aforesaid separation easy, the thermally conductive platform 30 and the vertically movable mechanism 40 are previously connected by magnetic attraction.

The platform structure of the present invention is effective in precluding the deformation of the top portion of a tall scaffold for use in tissue engineering and ensuring the uniform distribution of dimensions of the internal structure of the scaffold for use in tissue engineering.

Figure 5:
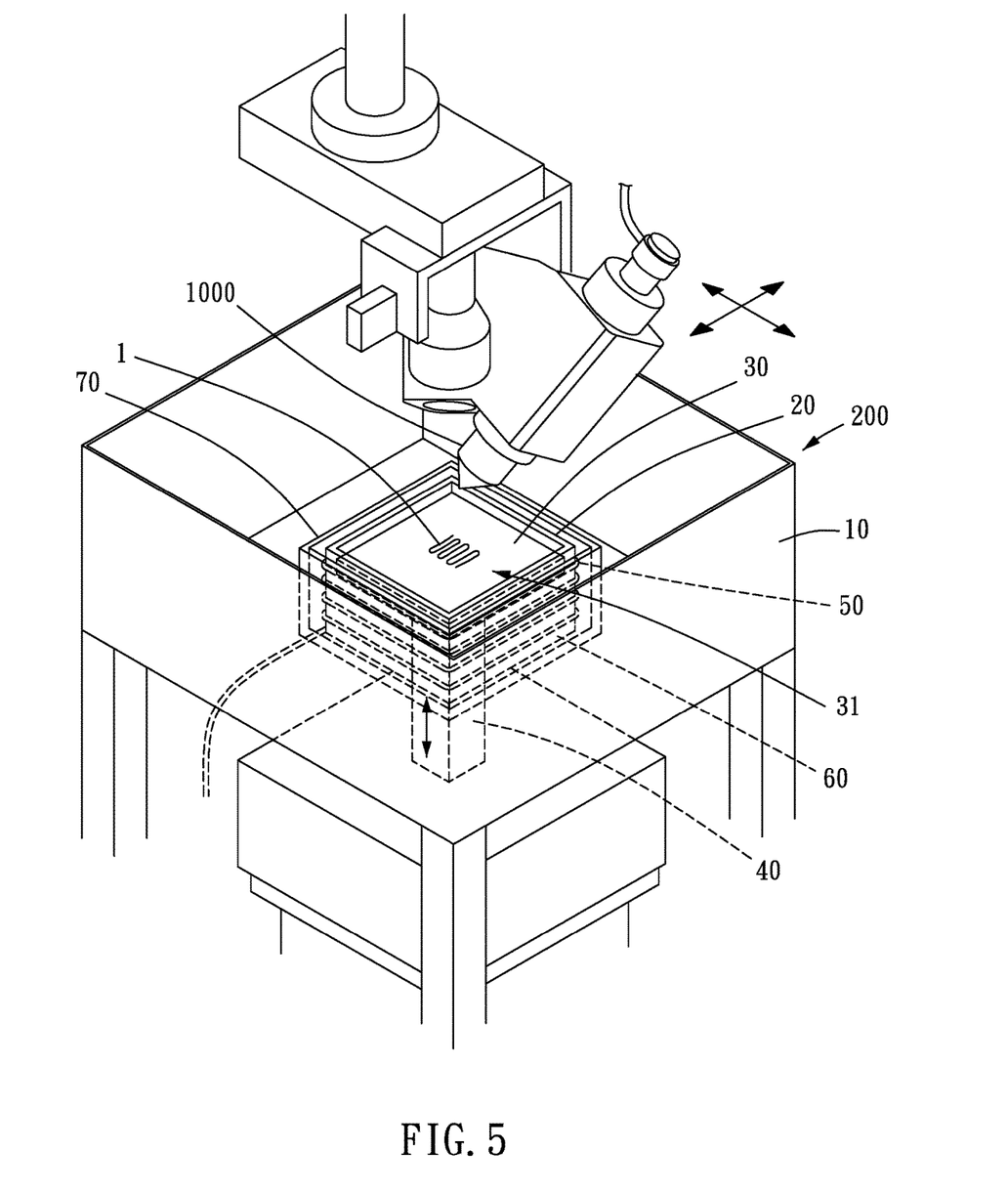
FIG. 5 is a schematic view of the platform structure according to the second embodiment of the present invention.
Figure 6:
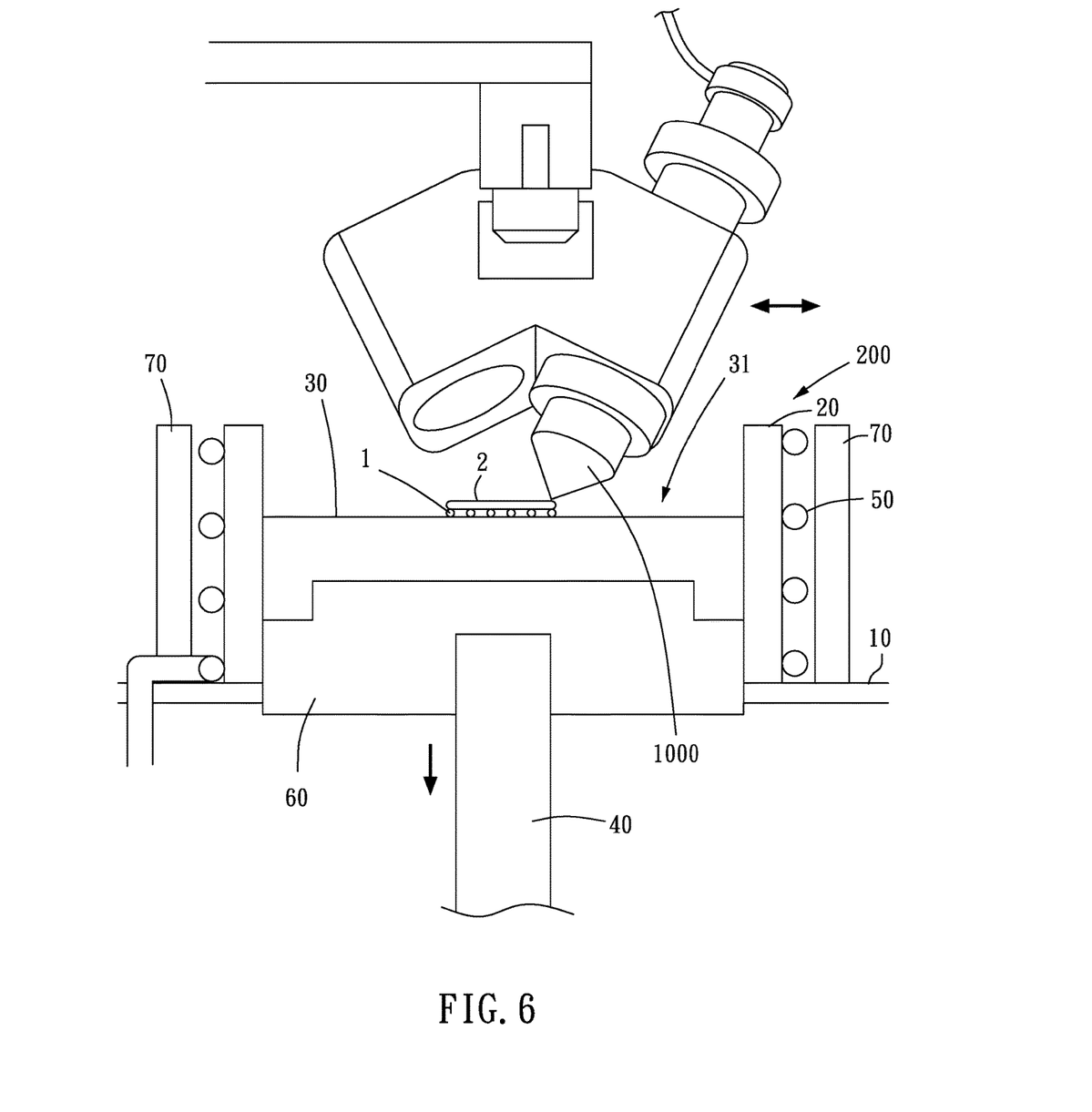
FIG. 6 is a cross-sectional view of the platform structure according to the second embodiment of the present invention.

Referring to FIG. 5 and FIG. 6, a platform structure 200 is provided in the second embodiment. The platform structure 200 is substantially the same as the platform structure 100, except that the platform structure 200 further comprises a thermally insulating board 60 and a thermally insulating element 70. The thermally insulating board 60 is disposed between the thermally conductive platform 30 and the vertically movable mechanism 40. The thermally insulating element 70 encloses the low temperature generating mechanism 50. The thermally insulating board 60 prevents heat exchange from happening to the thermally conductive platform 30 and thus prevents the vertically movable mechanism 40 from malfunctioning at a low temperature. The thermally insulating element 70 ensures that heat exchange occurs between the low temperature generating mechanism 50 and the ring-shaped thermally conductive member 20 to thereby enhance the heat transfer carried out with the low temperature generating mechanism 50.

To facilitate subsequent processing, such as freeze-drying, it is feasible to separate the thermally conductive platform 30 and the thermally insulating board 60 upon completion of the formation of the scaffold S for use in tissue engineering. To render the aforesaid separation easy, the thermally conductive platform 30 and the thermally insulating board 60 are previously connected by magnetic attraction, so are the thermally insulating board 60 and the vertically movable mechanism 40.

Referring to FIG. 6, when the sum of the thickness of the thermally insulating board 60 and the thickness of the thermally conductive platform 30 exceeds the height of the ring-shaped thermally conductive member 20, the thermally insulating board 60 prevents the ring-shaped thermally conductive member 20 from exchanging heat energy with the vertically movable mechanism 40. Furthermore, since the thermally insulating board 60 has a specific thickness, there will be no exchange of heat energy between the frame 10 and the ring-shaped thermally conductive member 20 even if the vertically movable mechanism 40 lowers the thermally conductive platform 30; hence, the inner wall of the ring-shaped thermally conductive member 20 is unlikely to frost up because of the ambient temperature of the frame 10, and thus the descent of the thermally conductive platform 30 is unlikely to be affected by frost.

The frame 10, the thermally insulating board 60 and the thermally insulating element 70 are preferably made of a material capable of thermal insulation, such as PEEK, to efficiently prevent ambient heat absorption, but the present invention is not limited thereto. Furthermore, the ring-shaped thermally conductive member 20 and the thermally conductive platform 30 are preferably made of stainless steel and thus are not only corrosion-resistant but also easy to sterilize, but the present invention is not limited thereto.

In conclusion, a platform structure of the present invention precludes the deformation of the top portion of a tall scaffold S for use in tissue engineering such that the manufacturing of tall scaffolds for use in tissue engineering is feasible, and the platform structure of the present invention enables the uniform distribution of the internal structure of a scaffold for use in tissue engineering.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A platform structure for manufacturing a scaffold for use in tissue engineering, comprising:
   a frame;
   a ring-shaped thermally conductive member fixedly disposed in the frame;
   a thermally conductive platform centrally movably disposed in the ring-shaped thermally conductive member and having edges in direct contact with inner walls of the ring-shaped thermally conductive member, wherein the thermally conductive platform and the ring-shaped thermally conductive member together define a space of a variable depth;
   a vertically movable mechanism connected to a bottom of the thermally conductive platform and adapted to drive the thermally conductive platform to sink and thus increase gradually the depth of the space;
   a low temperature generating mechanism connected to the ring-shaped thermally conductive member and the thermally conductive platform to cool down the ring-shaped thermally conductive member and the thermally conductive platform; and
   a nozzle having a head spaced apart from an opening at a top portion of the ring-shaped thermally conductive member by a fixed height;
   wherein the head of the nozzle is placed within the space of a variable depth defined by the thermally conductive platform and the ring-shaped thermally conductive member together when the scaffold for use in tissue engineering is being manufactured;
   wherein a portion of the nozzle is outside the ring-shaped thermally conductive member.

2. The platform structure of claim 1, wherein the low temperature generating mechanism is annularly disposed at an outer wall of the ring-shaped thermally conductive member.

3. The platform structure of claim 2, further comprising a thermally insulating element for enclosing the low temperature generating mechanism.

4. The platform structure of claim 1, further comprising a thermally insulating element for enclosing the low temperature generating mechanism.

5. The platform structure of claim 1, further comprising a thermally insulating board disposed between the thermally conductive platform and the vertically movable mechanism.

6. The platform structure of claim 5, wherein the thermally insulating board precludes heat exchange between the vertically movable mechanism and the ring-shaped thermally conductive member and the thermally conductive platform.

7. The platform structure of claim 6, wherein the thermally conductive platform and the vertically movable mechanism are connected by magnetic attraction.

8. The platform structure of claim 5, wherein the thermally conductive platform and the vertically movable mechanism are connected by magnetic attraction.

9. The platform structure of claim 1, wherein the thermally conductive platform and the vertically movable mechanism are connected by magnetic attraction.

10. A method of manufacturing a scaffold for use in tissue engineering, the method comprising the steps of:
   (S1) providing a platform structure for manufacturing a scaffold for use in tissue engineering, comprising: a frame; a ring-shaped thermally conductive member fixedly disposed in the frame; a thermally conductive platform centrally movably disposed in the ring-shaped thermally conductive member and having edges in direct contact with inner walls of the ring-shaped thermally conductive member, wherein the thermally conductive platform and the ring-shaped thermally conductive member together define a space of a variable depth; a vertically movable mechanism connected to a bottom of the thermally conductive platform and adapted to drive the thermally conductive platform to sink and thus increase gradually the depth of the space; a low temperature generating mechanism connected to the ring-shaped thermally conductive member and the thermally conductive platform to cool down the ring-shaped thermally conductive member and the thermally conductive platform; and a nozzle having a head spaced apart from an opening at a top portion of the ring-shaped thermally conductive member by a fixed height; wherein the head of the nozzle is placed within the space of a variable depth defined by the thermally conductive platform and the ring-shaped thermally conductive member together when the scaffold for use in tissue engineering is being manufactured; wherein a portion of the nozzle is outside the ring-shaped thermally conductive member;

(S3) squeezing, in the space, a liquid material out such that the liquid material deposits on a thermally conductive platform of the platform structure and freezes at low temperature, wherein the liquid material being squeezed out moves laterally relative to the platform structure;

(S5) lowering the thermally conductive platform with the vertically movable mechanism to increase the depth of the space; and (S7) squeezing out the liquid material in the space of the increasing depth to allow the liquid material to deposit on the frozen liquid material, wherein the liquid material thus deposited on the frozen liquid material freezes at low temperature, and the liquid material moves laterally relative to the platform structure while being squeezed out.

11. The method of manufacturing a scaffold for use in tissue engineering of claim 10, wherein the low temperature generating mechanism is annularly disposed at an outer wall of the ring-shaped thermally conductive member.

12. The method of manufacturing a scaffold for use in tissue engineering of claim 11, further comprising a thermally insulating element for enclosing the low temperature generating mechanism.

13. The method of manufacturing a scaffold for use in tissue engineering of claim 10, further comprising a thermally insulating element for enclosing the low temperature generating mechanism.

14. The method of manufacturing a scaffold for use in tissue engineering of claim 10, further comprising a thermally insulating board disposed between the thermally conductive platform and the vertically movable mechanism.

15. The method of manufacturing a scaffold for use in tissue engineering of claim 14, wherein the thermally insulating board precludes heat exchange between the vertically movable mechanism and the ring-shaped thermally conductive member and the thermally conductive platform.

16. The method of manufacturing a scaffold for use in tissue engineering of claim 15, wherein the thermally conductive platform and the vertically movable mechanism are connected by magnetic attraction.

17. The method of manufacturing a scaffold for use in tissue engineering of claim 14, wherein the thermally conductive platform and the vertically movable mechanism are connected by magnetic attraction.

18. The method of manufacturing a scaffold for use in tissue engineering of claim 10, wherein the thermally conductive platform and the vertically movable mechanism are connected by magnetic attraction.

* * * * *